United States Patent
Zhang

(10) Patent No.: US 7,583,152 B2
(45) Date of Patent: Sep. 1, 2009

(54) PHASE-LOCKED LOOP WITH SELF-CORRECTING PHASE-TO-DIGITAL TRANSFER FUNCTION

(75) Inventor: Gang Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 56 days.

(21) Appl. No.: 11/969,364

(22) Filed: Jan. 4, 2008

(65) Prior Publication Data

US 2009/0174492 A1    Jul. 9, 2009

(51) Int. Cl.
*H03L 1/02* (2006.01)
*H03L 7/085* (2006.01)
*H03L 7/089* (2006.01)
*H03L 7/18* (2006.01)
*H04B 1/40* (2006.01)

(52) U.S. Cl. .......................... 331/25; 331/1 A; 331/16; 331/17; 331/176; 455/76; 455/260

(58) Field of Classification Search ................ 331/1 A, 331/16–18, 25, 175, 176; 455/75, 76, 260
See application file for complete search history.

(56) References Cited

U.S. PATENT DOCUMENTS 4,752,748 A * 6/1988 Grzeszykowski ........... 331/1 A

OTHER PUBLICATIONS

Staszewski et al., "1.3 v 20 ps Time-to-Digital Converter for Frequency Synthesis in 90-nm CMOS," IEEE Transactions on Circuits and Systems-II: Express Briefs, vol. 53, No. 3, Mar. 2006.

* cited by examiner

*Primary Examiner*—David Mis
(74) *Attorney, Agent, or Firm*—Jiayu Xu

(57) ABSTRACT

A phase-locked loop includes a phase-to-digital converter portion as well as a novel correction portion. The phase-to-digital converter (PDC) portion outputs a stream of first phase error words. The novel correction portion receives the first phase error words and generates a stream of second phase error words that is supplied to a loop filter. The PDC portion has a phase-to-digital transfer function that exhibits certain imperfections. In a first example, the correction portion determines an average difference between pairs of first phase error words, and uses this average difference to normalize the first phase error words to correct for changes in PDC portion transfer function slope due to changes in delay element propagation delay. In a second example, the correction portion corrects for gain mismatches in PDC portion transfer function. In a third example, the correction portion corrects for offset mismatches in PDC portion transfer function.

24 Claims, 13 Drawing Sheets

PDC ADPLL

TDC ADPLL

PDC ADPLL

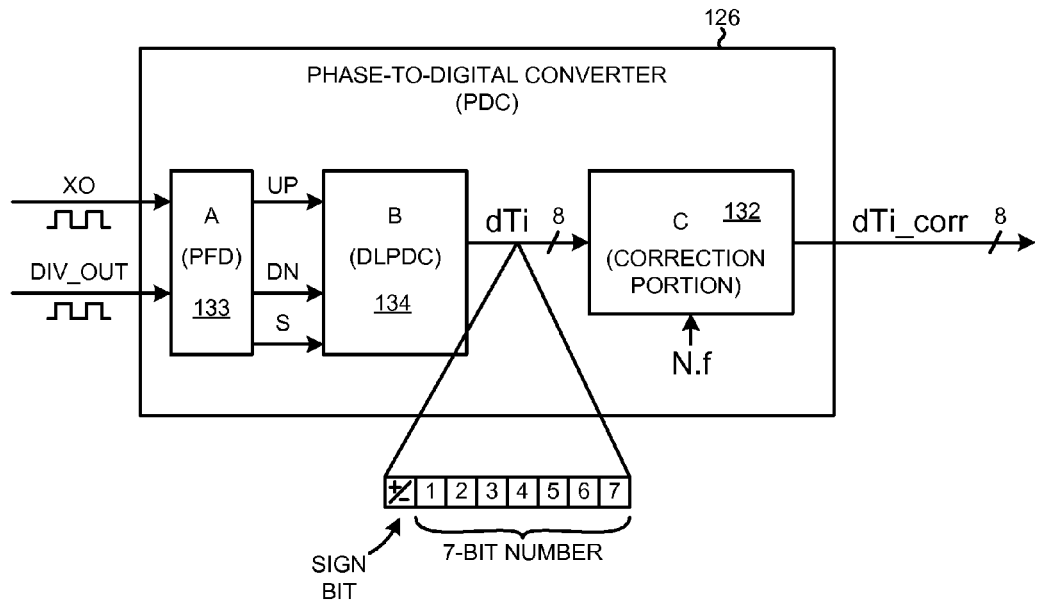
FIG. 11
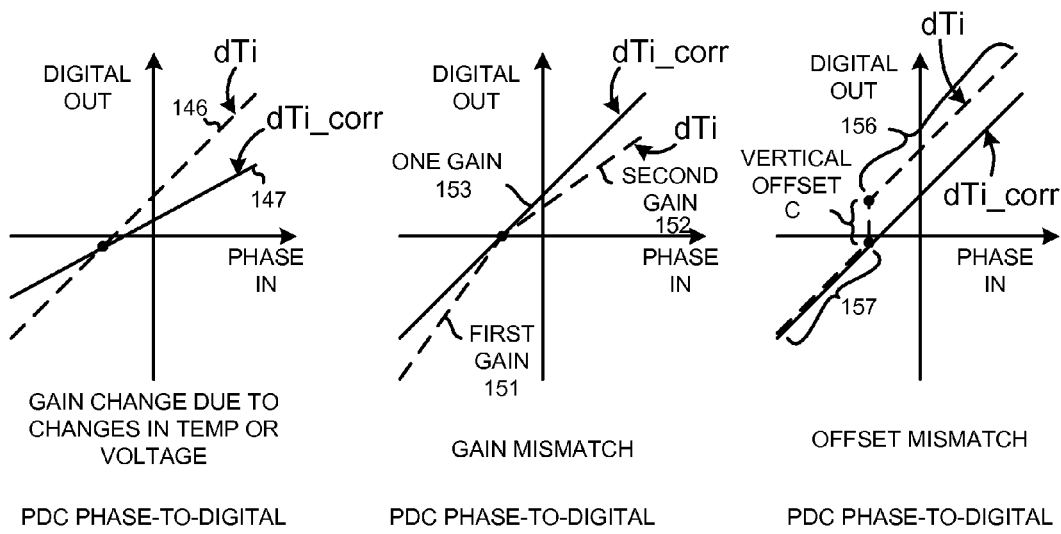
GAIN CHANGE DUE TO
CHANGES IN TEMP OR
VOLTAGE
PDC PHASE-TO-DIGITAL
TRANSFER FUNCTION
FIG. 12
GAIN MISMATCH
PDC PHASE-TO-DIGITAL
TRANSFER FUNCTION
FIG. 16
OFFSET MISMATCH
PDC PHASE-TO-DIGITAL
TRANSFER FUNCTION
FIG. 19

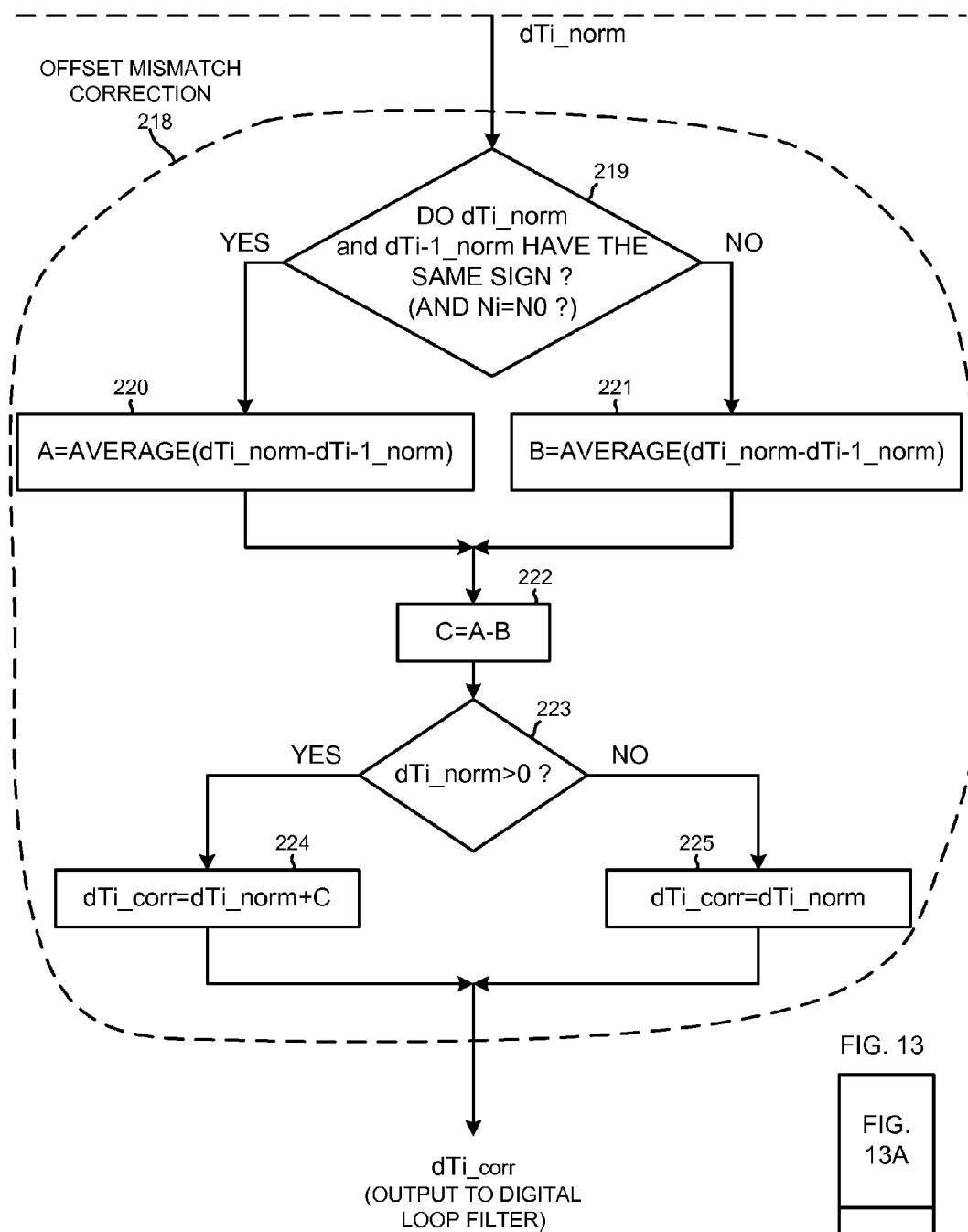
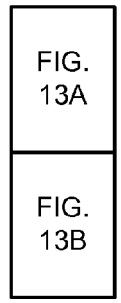
FIG. 13B

N.f = 100.1
  N0=101, k=1-0.1=0.9

At PVT1, INVERTER DELAY = 15ps
  dTi_1=10 (150ps), dTi-1_1=-5(75ps)
  dTi_1 - dTi-1_1=10-(-5)= (225ps)
SO THE SLOPE IS 15/0.9*TDCO=16.66/TDCO, WHERE TDCO IS THE DCO PERIOD.
  M1 = 0.9*1/15=0.06
  dTi_norm_1=10*0.06=0.6, dTi-1_norm_1=-5*0.06=-0.3
  AFTER CORRECTION : SLOPE=(0.6-(-0.3))/0.9TDCO=1/TDCO At PVT2, INVERTER DELAY = 25ps
  dTi_2=20 (500ps), dTi-1_2=11(275ps)
  dTi_2 - dTi-1_2=20-11= (225ps)
SO THE SLOPE IS 9/0.9*TDCO=10/TDCO, WHERE TDCO IS THE DCO PERIOD.
  M1 = 0.9*1/9=0.1
  dTi_norm_2=20*0.1=2, dTi-1_norm_2=11*0.1=1.1
  AFTER CORRECTION : SLOPE=(2-1.1)/0.9TDCO=1/TDCO

SO AFTER CORRECTION BOTH SLOPES BECOME 1/TDCO

EXAMPLE #1: PVT CORRECTION

FIG. 14

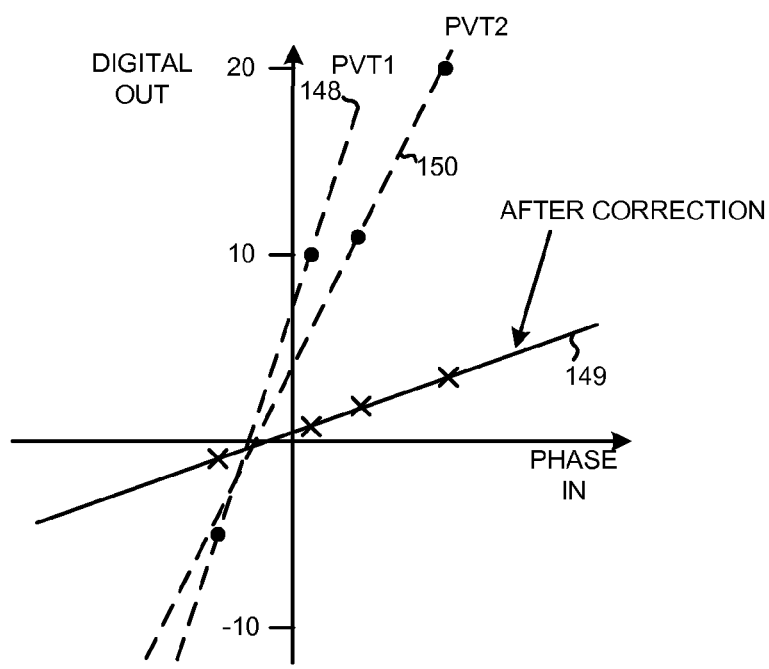

ASSUME DELAY MISMATCH:
INVERTER DELAY = 20 ps FOR (dT>0)
INVERTER DELAY = 18 ps FOR (dT<0)
TWO dTi VALUES WITH dT>0:
  dTi_a=10 (200ps), dTi-1_a= 1 (20ps)
  dTi_a - dTi-1_a = 9 (180ps)
  M2 = 0.9 * (1/9) = 0.1
  dTi_norm_a = 10*0.1 = 1, dTi-1_norm_a= 1*0.1 =0.1
  SO THE SLOPE IS: (1-0.1)/0.9TDCO=1/TDCO.

TWO dTi VALUES WITH dT<0:
  dTi_b= -1 (-18ps), dTi-1_b= -11(-198ps)
  dTi_b - dTi-1_b = 10 (180ps)
  M1 = 0.9 * (1/10) = 0.09
  dTi_norm_b= -1*0.09 = -0.09, dTi-1_norm_b = -11*0.09 = 0.99
  SO THE SLOPE IS: (-.09-(-0.99))/0.9TDCO=1/TDCO.

SO THE TWO SIDES ARE NORMALIZED TO HAVE THE SAME SLOPE OF 1/TDCO.

EXAMPLE #2 - PART A: GAIN MISMATCH CORRECTION

FIG. 17

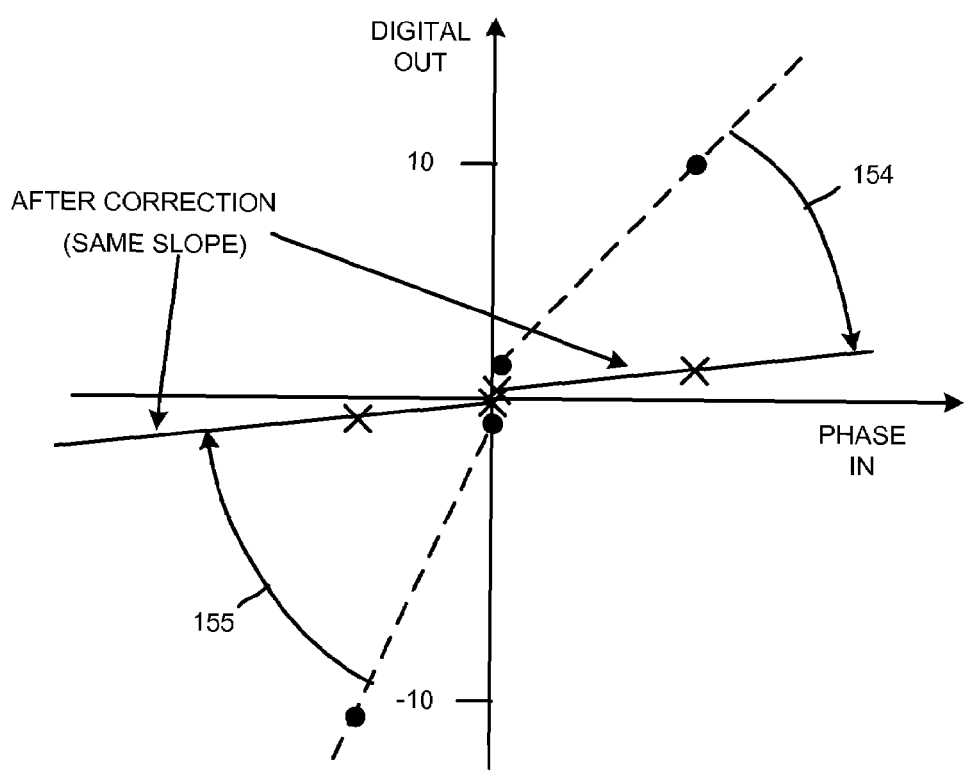

FIG. 18

TWO dTi VALUES, ONE IS POSITIVE, ONE IS NEGATIVE:
dTi>0: dTi_norm_c = 1
dTi-1<0: dTi-1_norm_c = -0.3
B = dTi_norm_c - dTi-1_norm_C = 1-(-0.3) = 1.3

FROM FIG. 17, WHEN THE TWO VALUES dTi_norm HAVE THE SAME SIGN:
dTi_norm_a=1
dTi-1_norm_a=0.1
A=dTi_norm - dTi-1_norm=0.9

SO THE OFFSET IS:
 C=A-B=0.9-1.3=0.4

SO FOR VALUES >0, dTi_corr=dTi_norm + C = dTi_norm -0.4
 dTi_corr_a = 1-0.4=0.6
 dTi-1_corr_a = 0.1-0.4=-0.3
 dTi-1_corr_c = 1-0.4=0.6

EXAMPLE #2 - PART B: OFFSET MISMATCH CORRECTION

PHASE-LOCKED LOOP WITH SELF-CORRECTING PHASE-TO-DIGITAL TRANSFER FUNCTION

BACKGROUND INFORMATION

1. Technical Field

The disclosed embodiments relate to the correction of the transfer function of a phase-to-digital (PDC) converter in an all digital phase-locked loop (ADPLL).

2. Background Information

Phase-locked loops are used in many applications, including use in local oscillators of cellular telephone receivers and transmitters. In the past, such phase-locked loops as employed in cellular telephones were generally implemented with analog circuitry. More recently, however, digital implementations of phase-locked loops have been employed. These phase-locked loops are often referred to as All-Digital Phase-Locked Loops (ADPLLs). There are several categories of ADPLL circuits including, for example, so-called Phase-to-Digital Converter PLLs (PDC ADPLLs) and so-called Time-to-Digital PLLs (TDC ADPLLs).

FIG. 1 (Prior Art) is a high level simplified conceptual circuit diagram of a TDC ADPLL 1. TDC ADPLL 1 involves a loop filter 2 that outputs a stream of digital tuning words. A Digitally Controlled Oscillator (DCO) 3 receives a digital tuning word and outputs a corresponding signal HCLK whose frequency is determined by the digital tuning word. A Time-to-Digital Converter (TDC) 4 receives the HCLK signal as well as a reference clock FREF and outputs a fractional part of a phase error word. The phase error word is indicative of a phase error between the FREF signal and the HCLK signal. An accumulator 5 outputs an integer portion of the phase error word. A summer 6 sums corresponding integer portions and fractional portions to output a stream of digital phase error words. The stream of digital phase error words is supplied to loop filter 2. When the loop is locked, the phase of HCLK is locked to the phase of the reference clock FREF. For additional information on a TDC ADPLL, see the article entitled "1.3 V 20 ps Time-to-Digital Converter for Frequency Synthesis in 90-nm CMOS", IEEE Transactions on Circuits and Systems—II, Vol. 53, No. 3, March 2006, by Staszweski et al.

FIG. 2 (Prior Art) is a circuit diagram of TDC 4 of FIG. 1. TDC 4 includes a chain of inverters 7, an associated set of flip-flops 8, a decoder 9, and self-calibrating normalization circuitry 10-12. FIG. 3 (Prior Art) is a waveform diagram that illustrates the signals FREF and HCLK as they are supplied to the inputs of TDC 4. FIG. 4 (Prior Art) is a waveform diagram that illustrates the values D1-D10 that are output by the corresponding inverters along the chain of inverters 7. At a point in time indicated by the vertical dashed line 13 in the waveform diagram, the set of flip-flops 8 is clocked by the rising edge of the signal FREF. The values of the various inverters are then output in parallel as a word Q(1:10) to decoder 9. The word Q(1:10) contains information on the time separation between the rising edge of FREF and the rising and falling edges of HCLK. The word Q(1:10) is decoded by decoder 9 to output a six-bit falling time $\Delta t_f$ and a six-bit rising time value $\Delta t_r$. The six-bit falling time value $\Delta t_f$ is indicative of the time between the falling edge of HCLK and the rising edge of FREF. The six-bit rising time value $\Delta t_r$ is indicative of the time between the rising edge HCLK and the rising edge of FREF. As indicated in FIG. 2, the values $\Delta t_f$ are, after being normalized by multiplier 12, the outputs OUT of the TDC. If the delays through the inverters of the inverter chain were to change due to variations in process, voltage and/or temperature, then the resulting values $\Delta t_r$ would also change and the phase-to-digital conversion gain would change. The TDC therefore self-calibrates to account for variations in inverter delay over changes in process, voltage and temperature (PVT). Blocks 10 and 11 generate values that are supplied to multiplier 12 to self-calibrate the stream of $\Delta t_r$ values.

FIG. 5 (Prior Art) is a simplified block diagram of one circuit topology 14 of a Phase-to-Digital Converter All-Digital Phase-locked Loop (PDC ADPLL). In one PDC ADPLL, the loop filter 15 is to receive signed numbers from the Phase-to-Digital Converter 16. The TDC ADPLL topology of FIG. 2, however, does not generate positive and negative values of $\Delta t_r$ values. Moreover, the period of the loop divider 17 output DIV_OUT in the PDC ADPLL may be many times (for example, a thousand times) longer than the period of HCLK depending on the value by which loop divider 17 divides. Providing a delay chain long enough to capture an entire high pulse of DIV_OUT may be unworkable and impractical. In addition, the technique employed in the TDC ADPLL of FIG. 2 involves supplying the DCO output signal HCLK into a chain of inverters. If the DCO output signal HCLK is of a high frequency such as 4 GHz, then the inverters of the delay chain that receive HCLK would be made to switch at a high frequency. If the inverters are complementary logic (CMOS) inverters, then the current consumption of the circuit would be undesirably high. Accordingly, the prior art technique of FIG. 2 is undesirable and cannot be effectively employed for self-calibration in a PDC ADPLL for multiple reasons.

SUMMARY

A Phase-to-Digital Converter All-Digital Phase-Locked Loop (PDC ADPLL) includes a phase-to-digital converter, a digital loop filter, a digitally-controlled oscillator (DCO), and a loop divider. The loop divider is controlled by a sigma-delta modulator to divide over time by a fractional divisor value N.f, wherein N is an integer portion and f is a fractional portion. The phase-to-digital converter receives a reference clock signal XO from a reference signal source and receives a feedback signal DIV_OUT from the loop divider, and generates a stream of second phase error words. The stream of second phase error words is supplied to the digital loop filter. The phase-to-digital converter includes a phase-to-digital converter portion as well as a novel correction portion. The phase-to-digital converter portion receives the reference signal XO and the feedback signal DIV_OUT and generates a stream of first phase error words. The novel correction portion receives the stream of first phase error words and performs novel processing and generates the stream of second phase error words.

In one example, the phase-to-digital converter portion has a phase-to-digital transfer function that exhibits a slope. The slope is affected by changes in propagation delay of delay elements in a delay line in the phase-to-digital converter portion. In one case, the changes in delay element propagation delay are due to changes in PVT (process, and/or supply voltage, and/or temperature). The novel correction circuit receives the stream of first phase error words and generates the stream of second phase error words such that the phase-to-digital converter portion and the correction portion together have an overall phase-to-digital transfer function whose slope is substantially independent of changes in delay element propagation delay.

In one specific implementation, the correction portion is an amount of digital logic that receives a first of the first phase error words dTi−1 and a second of the first phase error words dTi, where one of the first phase error words is generated when the loop divider is dividing by a divisor value N, and wherein the other of the first phase error words is generated when the loop divider is dividing by a divisor value N+1. The correction circuit determines a difference between dTi and dTi−1, and uses this difference to determine a multiplier value. The correction portion then uses the multiplier value to normalize first phase error words such that the slope of the phase-to-digital transfer function of the resulting second phase error words is normalized and is substantially independent of changes in delay element propagation delay. In one example, the period of the feedback signal DIV_OUT is substantially greater than twice the propagation delay time through the entire delay line of the phase-to-digital converter portion. As the PDC ADPLL operates, the correction portion adjusts the multiplier value such that the slope of the overall phase-to-digital transfer function of the phase-to-digital converter portion and the correction portion together is substantially constant.

In another example, the phase-to-transfer function of the phase-to-digital converter portion exhibits a gain mismatch imperfection. The correction portion processes a first set of the first phase error words differently than a second set of the first phase error words such that the transfer function slope of a first portion of the phase-to-transfer function is adjusted in a first way, and such that the transfer function slope of a second portion of the phase-to-digital function is adjusted in the second way. The result is that the overall phase-to-digital transfer function (of the phase-to-digital converter portion and the correction portion together) does not exhibit the gain mismatch.

In another example, the phase-to-transfer function of the phase-to-digital converter portion exhibits an offset mismatch imperfection. From the stream of first phase error words, the correction portion determines the magnitude of the offset and then adjusts appropriate ones of the first phase error words by the determined magnitude of the offset, such that the overall phase-to-digital transfer function (of the phase-to-digital converter portion and the correction portion together) does not exhibit the offset mismatch. In one specific embodiment, the novel correction portion is an amount of purely digital logic that corrects for delay element variations, gain mismatches, and offset mismatches.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 11 is a simplified block diagram of the PDC 126 in the local oscillator 106.

FIG. 12 illustrates how the novel correction portion 132 corrects gain changes in the phase-to-digital transfer function of DLPDC 134.

FIGS. 13A and 13B are a flowchart that illustrates a flow of processing through the novel correction portion 132.

FIG. 14 sets forth an example of how the novel correction circuit 132 corrects for changes in DLPDC phase-to-digital transfer function gain due to changes in delay element propagation delay (for example, due to PVT changes).

FIG. 15 is a graph that illustrates the correction operation of FIG. 14.

FIG. 16 illustrates how the novel correction portion 132 corrects gain mismatch imperfections in a DLPDC phase-to-digital transfer function.

FIG. 17 sets forth an example of how the novel correction circuit 132 corrects for gain mismatch imperfections in a DLPDC phase-to-digital transfer function.

FIG. 18 is a graph that illustrates the correction operation of FIG. 17.

FIG. 19 illustrates how the novel correction portion 132 corrects offset mismatch imperfections in a DLPDC phase-to-digital transfer function.

DETAILED DESCRIPTION

Figure 1:
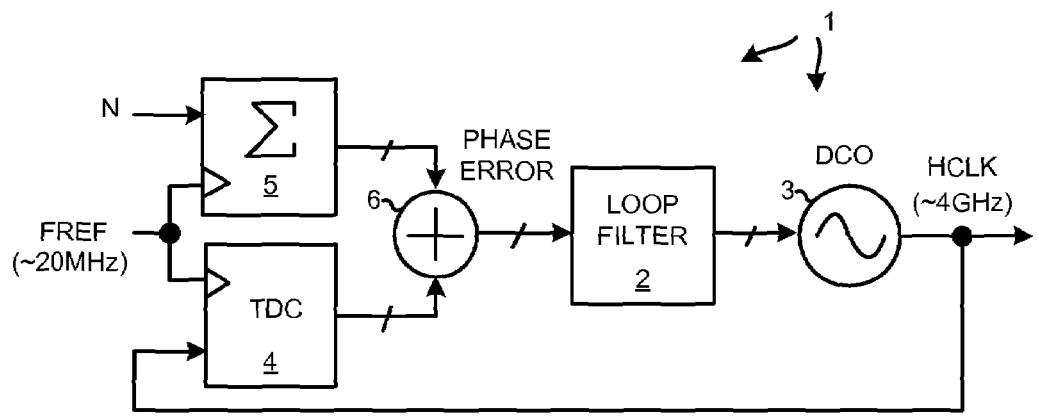
FIG. 1 (Prior Art) is a circuit diagram of a Time-to-Digital Converter All-Digital Phase-Locked Loop (TDC ADPLL).
Figure 2:
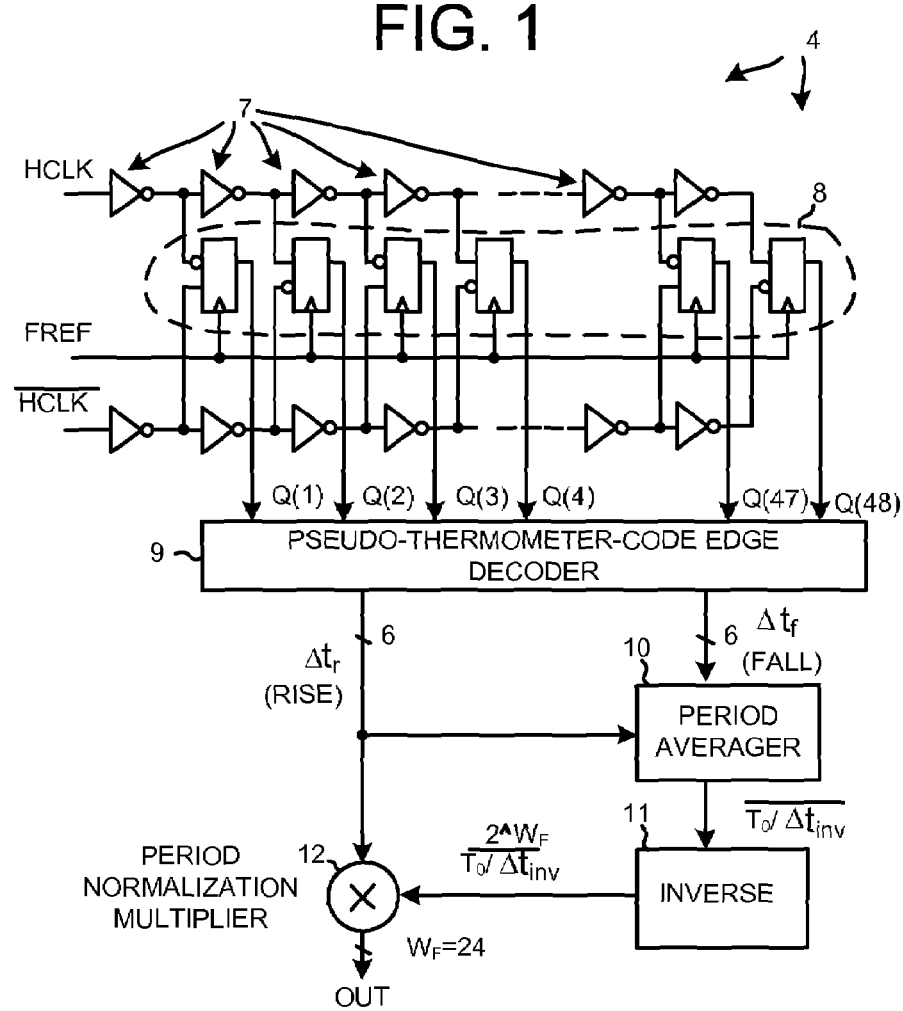
FIG. 2 (Prior Art) is a more detailed circuit diagram of the Time-to-Digital Converter 4 within the TDC ADPLL of FIG. 1.
Figure 3:
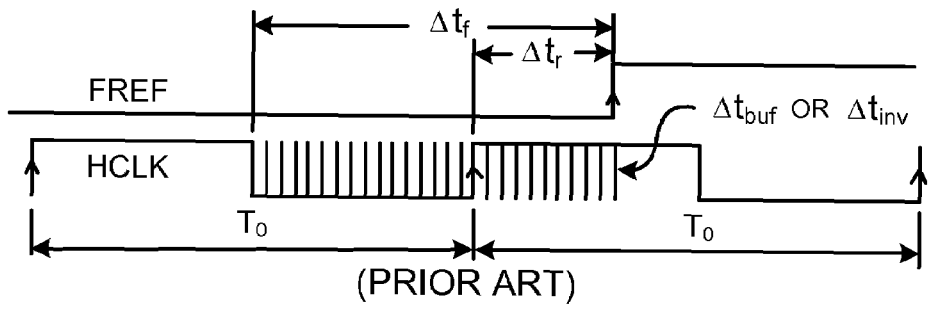
FIG. 3 (Prior Art) is a waveform diagram that illustrates the signals FREF and HCLK as they are supplied to the inputs of the TDC 4 of the TDC ADPLL of FIG. 1.
Figure 4:
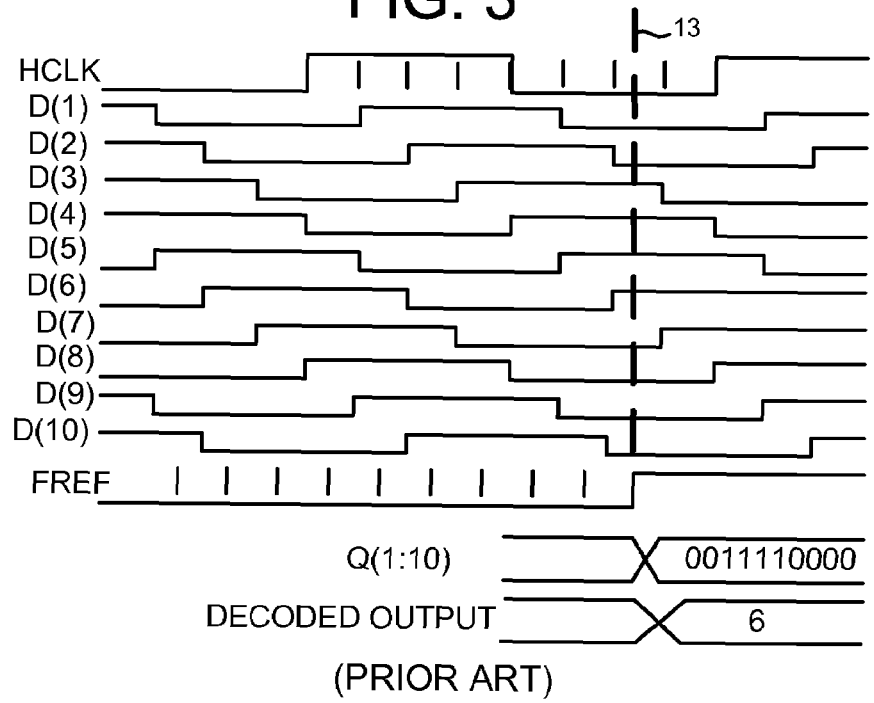
FIG. 4 (Prior Art) is a waveform diagram that illustrates operation of the TDC 4 of the TDC ADPLL of FIG. 1.
Figure 5:
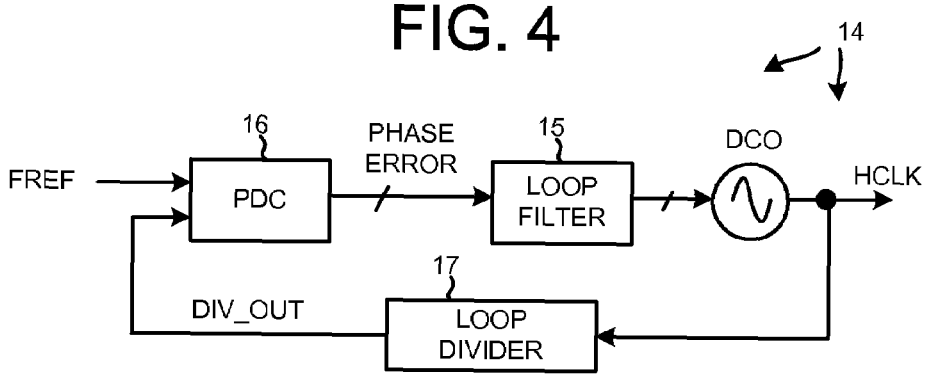
FIG. 5 (Prior Art) is a simplified block diagram of a Phase-to-Digital Converter All-Digital Phase-Locked Loop (PDC ADPLL).
Figure 6:
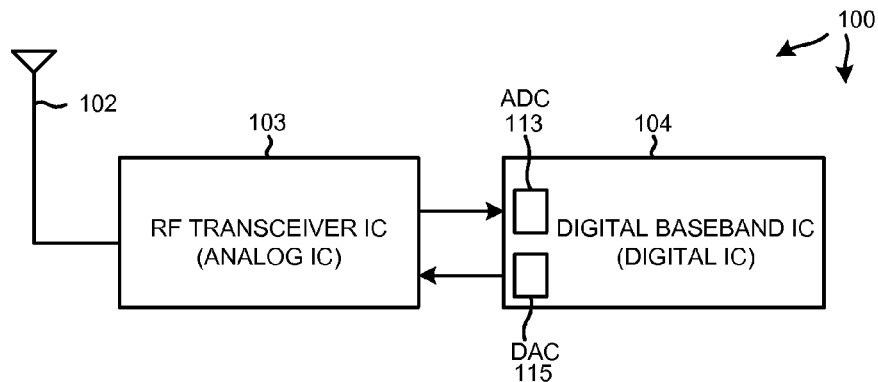
FIG. 6 is a very simplified high level block diagram of one particular type of mobile communication device 100 in accordance with one novel aspect.

FIG. 6 is a very simplified high level block diagram of one particular type of mobile communication device 100 in accordance with one novel aspect. In this example, mobile communication device 100 is a cellular telephone that uses a Code Division Multiple Access (CDMA) cellular telephone communication protocol. The cellular telephone includes (among several other parts not illustrated) an antenna 102 and two integrated circuits 103 and 104. Integrated circuit 104 is called a "digital baseband integrated circuit" or a "baseband processor integrated circuit". Integrated circuit 103 is an RF transceiver integrated circuit. RF transceiver integrated circuit 103 is called a "transceiver" because it includes a transmitter as well as a receiver.

Figure 7:
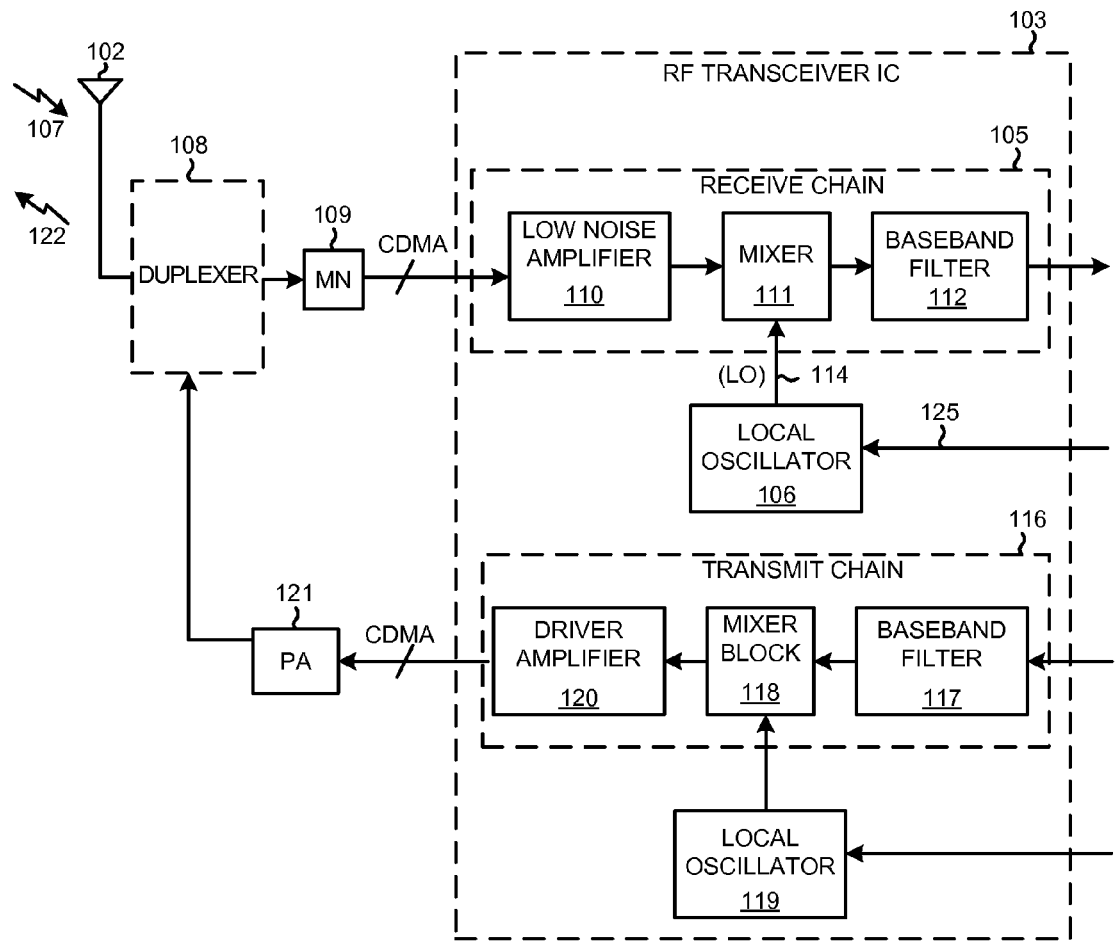
FIG. 7 is a more detailed block diagram of the RF transceiver integrated circuit 103 of FIG. 6.

FIG. 7 is a more detailed block diagram of the RF transceiver integrated circuit 103 of FIG. 6. The receiver includes what is called a "receive chain" 105 as well as a local oscillator (LO) 106. When the cellular telephone is receiving, a high frequency RF signal 107 is received on antenna 102. Information from signal 107 passes through duplexer 108, matching network 109, and through the receive chain 105. Signal 107 is amplified by low noise amplifier (LNA) 110 and is down-converted in frequency by mixer 111. The resulting down-converted signal is filtered by baseband filter 112 and is passed to the digital baseband integrated circuit 104. An analog-to-digital converter 113 in the digital baseband integrated circuit 104 converts the signal into digital form and the resulting digital information is processed by digital circuitry in the digital baseband integrated circuit 104. The digital baseband integrated circuit 104 tunes the receiver by controlling the frequency of the local oscillator signal (LO) supplied on local oscillator output 114 to mixer 111.

If the cellular telephone is transmitting, then information to be transmitted is converted into analog form by a digital-to-analog converter 115 in the digital baseband integrated circuit 104 and is supplied to a "transmit chain" 116. Baseband filter 117 filters out noise due to the digital-to-analog conversion process. Mixer block 118 under control of local oscillator 119 then up-converts the signal into a high frequency signal. Driver amplifier 120 and an external power amplifier 121 amplify the high frequency signal to drive antenna 102 so that a high frequency RF signal 122 is transmitted from antenna 102.

Figure 8:
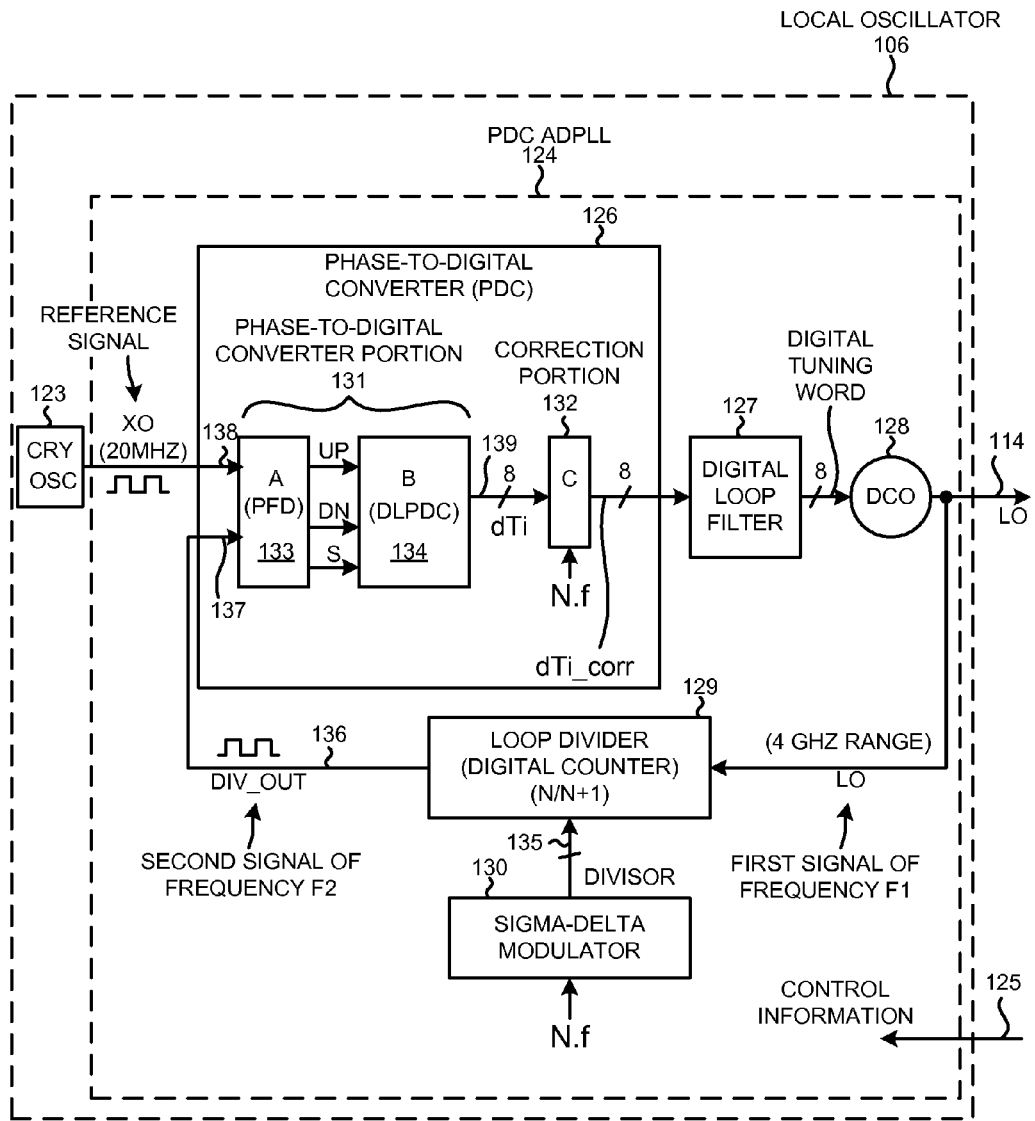
FIG. 8 is a circuit diagram that shows the local oscillator 106 of the RF transceiver integrated circuit 103 in further detail.

FIG. 8 is a circuit diagram that shows local oscillator 106 in further detail. Local oscillator 106 includes a crystal oscillator 123 and a Phase-to-Digital (PDC) All-Digital Phase-Locked Loop (ADPLL) 124. Digital baseband integrated circuit 104 controls the frequency of the local oscillator output signal LO by sending control information across to the RF transceiver integrated circuit 103. This control information determines a fractional F divisor value (N.f). The arrow 125 in FIG. 8 represents the transfer of this control information, and not a particular connection over which the control information is passed. The control information may, for example, be communicated from integrated circuit 104 to integrated circuit 103 across a serial bus along with other information.

PDC ADPLL 124 includes a Phase-to-Digital Converter (PDC) 126, a digital loop filter 127, a Digitally-Controlled Oscillator (DCO) 128, a loop divider 129, and a sigma-delta modulator 130. PDC 126 in turn includes a phase-to-digital converter portion 131 and a correction portion 132. PDC portion 131 includes a Phase-Frequency Detector (PFD) 133 and a Delay Line Phase-to-Digital Converter (DLPDC) 134. DCO 128 receives a stream of eight-bit digital tuning words. At a given time, the digital tuning word received by DCO 128 determines the frequency of the local oscillator output signal LO that is output by the DCO 128. The local oscillator signal LO is in this example a digital signal in the 4 GHz range.

Loop divider 129 frequency divides the single-bit local oscillator signal by a multi-bit digital divisor value received from sigma-delta modulator 130 via lines 135, and outputs the resulting divided-down single-bit signal DIV_OUT onto conductor 136 and to a second input 137 of PFD 133. Sigma-delta modulator 130 changes the divisor value from an integer value N to the next integer N+1 over time such that over time the frequency of LO is divided by the fractional F value N.f. The "N" in the fractional F value "N.f" represents an integer, whereas the ".f" in the fractional value "N.f" represents a fractional value. As described above, the fractional value N.f by which the loop divider divides is known to the local oscillator 106 after having been received from the digital baseband integrated circuit 104.

PDC portion 131 receives a reference clock signal XO from crystal oscillator 123 on a first input 138 of PFD 133, and also receives the DIV_OUT signal on the second input 137 of PFD 133. PDC portion 131 outputs a stream of first phase error words dTi onto conductors 139. In this example, each first phase error word is an eight-bit digital value, whose first bit is a sign bit. The sign bit indicates the phase of the XO signal on input 138 with respect to the phase of the DIV_OUT signal on input 137. The remaining seven bits of the phase error word is a number that indicates the degree to which the two signals are out of phase with respect to one another.

The novel correction portion 132 receives the stream of first phase error words dTi and outputs a stream of second phase error words dTi_corr. Each second phase error word is also an eight-bit digital value, whose first bit is a sign bit. Operation of the novel correction portion 132 is described in further detail in the description below.

Digital loop filter 127 receives the stream of second phase error words dTi_corr and outputs a filtered stream of values. There is one such value output from digital loop filter 127 for each second phase error word received by digital loop filter 127. The values output by digital loop filter 127 are referred to here as digital tuning words.

The PDC 126, digital loop filter 127, DCO 128, and loop filter 129 function together as a phase-locked loop such that the phase of DIV_OUT is locked with respect to the phase of the reference clock signal XO. The frequency F2 of DIV_OUT is the same as the frequency of reference clock signal XO. In the present example, the frequency of reference clock signal XO is 20 MHz. Because loop divider 129 frequency-divides by fractional F value N.f, the frequency of the local oscillator output signal LO is F2*(N.f). If, for example, N.f is 200.1, and F2 is 20 MHz, then the frequency F1 of LO is 4.002 GHz.

Figure 9A:
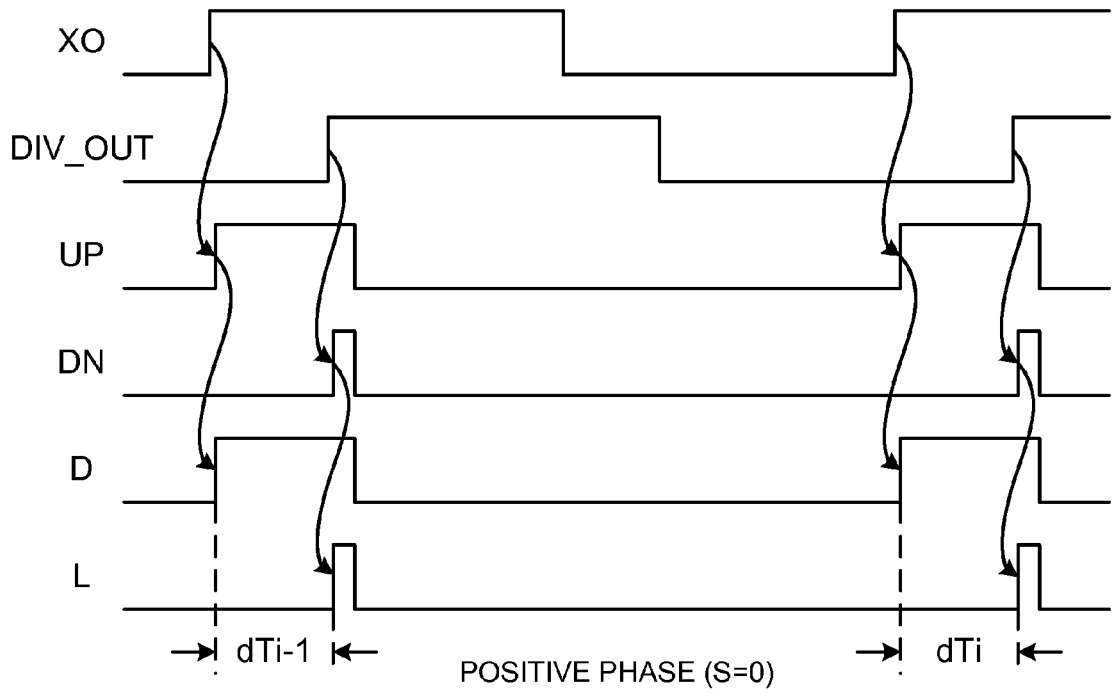
FIG. 9A is a waveform diagram that illustrates operation of the PFD 133 in the local oscillator 106 in a positive phase condition.

FIG. 9A is a waveform diagram that illustrates an operation of PFD 133. PFD 133 outputs three digital signals UP, DN and S. Signal UP transitions high on a rising edge of the reference clock signal XO. Signal DN transitions high on a rising edge of the DIV_OUT signal. Shortly after both signals UP and DN are asserted high, both signals UP and DN are made to transition low asynchronously. The UP and DN signals are communicated to DLPDC 134. Signal S is a sign signal. If the reference clock signal XO transitions high before the DIV_OUT signal transitions high, then the sign signal S is a digital zero, otherwise the sign signal S is a digital one.

Figure 10:
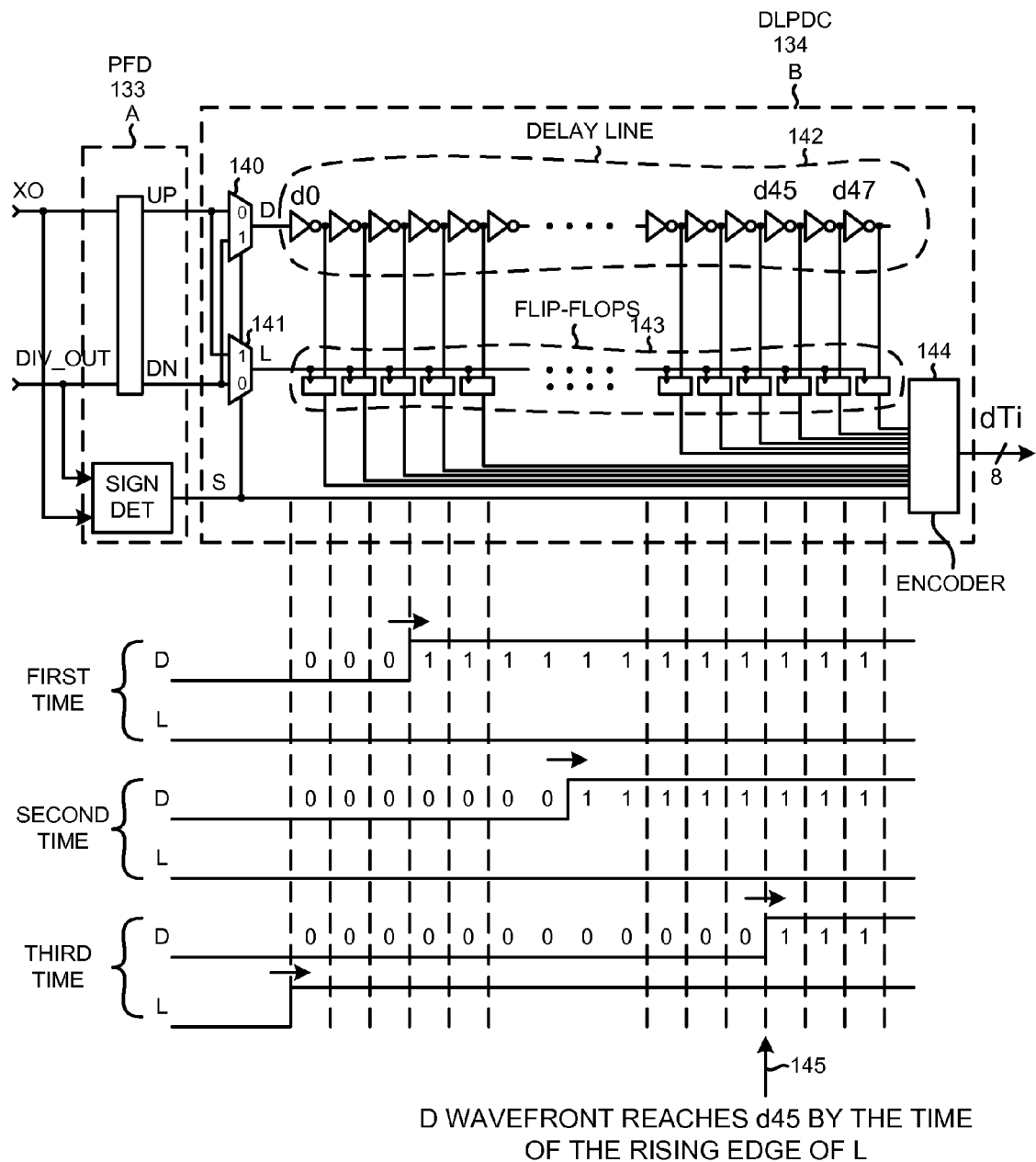
FIG. 10 is a simplified circuit diagram and associated waveform diagram that illustrates how the DLPDC 134 in the local oscillator 106 of FIG. 8 operates.

FIG. 10 is a simplified circuit diagram and associated waveform diagram that illustrates how DLPDC 134 converts the UP and DN signals into a first phase error word dTi. DLPDC 134 includes a pair of multiplexers 140, 141, a chain of delay elements 142, a set of sequential logic elements 143, and an encoder 144. The chain of delay elements 142 is also referred to as a delay line. The delay elements in the illustrated example are inverters. The sequential logic elements in the illustrated example are flip-flops. Consider the positive phase situation of the incoming signals XO and DIV_OUT illustrated in FIG. 9A. The first rising edge of XO causes the signal UP to transition from low to high. The sign signal S is a digital logic low. The low-to-high transition of the signal UP is therefore passed through multiplexer 140 and is introduced as signal D into the delay line 142. The rising edge propagates from left to right through the delay line. The upper two waveforms labeled "FIRST TIME" indicate a first time in which the rising edge has propagated through three of the inverters of the delay line. The next two waveforms labeled "SECOND TIME" indicate a later time in which the rising edge has propagated through more of the inverters of the delay line. Next, the DIV_OUT signal transitions high in the phase example of FIG. 9A. This low-to-high transition causes the DN signal to transition from low to high. As indicated in FIG.

10, the DN signal is supplied through multiplexer 141 as signal L onto the clock input leads of the flip-flops 143. All the flip-flops are clocked to capture data at the same time on the rising edge of the signal L. Because the data input D of one flip-flop is coupled to each respective one of the inverter outputs in the delay line, the flip-flops capture information indicating how far down the delay line 142 the rising edge of UP went before the rising edge of the L signal occurred. The bottom two waveforms labeled "THIRD TIME" indicate the time when the signal L transitions high, causing the flip-flops to be clocked. The arrow 145 indicates how far the low-to-high wavefront of the signal D went down the delay line before the rising edge of signal L occurred. Encoder 144 receives the outputs of the flip-flops 143, along with the sign signal S, and encodes the information into an eight-bit signed first phase error word dTi.

Figure 9B:
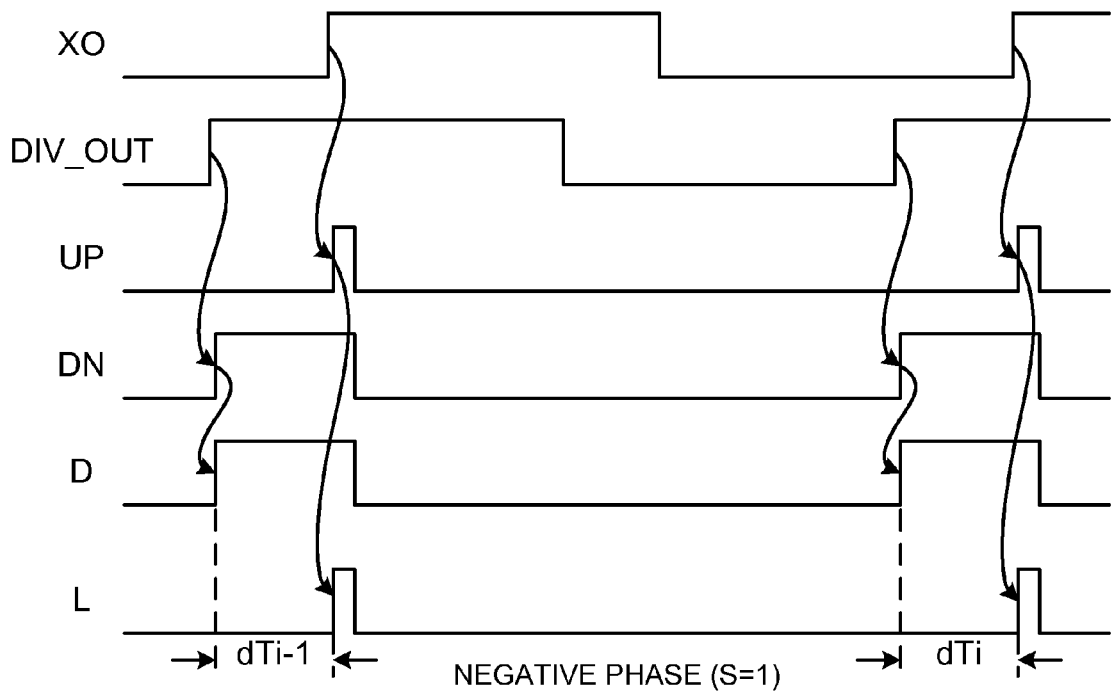
FIG. 9B is a waveform diagram that illustrates operation of the PFD 133 in the local oscillator 106 in a negative phase condition.

FIG. 9B is a waveform diagram that illustrates an operation of PFD 133 when the reference clock signal XO transitions high after the DIV_OUT signal transitions high. As in the example of FIG. 9A, PFD 133 asserts the signal DN high on a rising edge of the DIV_OUT signal and asserts the signal UP high on the rising edge of reference clock signal XO. Also, as in the example of FIG. 9A, shortly after both signals UP and DN are asserted high, both signals UP and DN are made to transition low asynchronously. In the example of FIG. 9B, however, the sign signal S has a digital high value because the signal XO transitions high after the signal DIV_OUT. Multiplexer 140 therefore supplies the DN signal as signal D into the delay line 142, and multiplexer 141 supplies the UP signal as signal L onto the clock input leads of the flip-flops 143. Note that the D and L waveforms of FIGS. 9A and 9B looks similar, even though the relative phases of the XO and DIV_OUT signals in the examples of FIGS. 9A and 9B differ. The low-to-high transition of the D signal therefore travels the same distance down the delay line 142 in the example of FIG. 9A as in the example of FIG. 9B before the low-to-high transition of the signal L occurs. In the example of FIG. 9B, however, the value of the sign signal S is a digital high as opposed to a digital low as it was in the example of FIG. 9A.

FIG. 11 is a simplified block diagram of PDC 126 showing a representation of a signed first phase error word dTi.

The delay through a delay element of the delay line 142 of FIG. 10 is not always constant but rather may change due to any one of a number of reasons. The delay may change over process, supply voltage, and/or operating temperature (PVT). Because the phase between the signals XO and DIV_OUT is measured by phase-to-digital converter portion 131 in terms of a number of delay element delays, if the propagation delay through a delay element were to change, then the dTi first phase error word as output from the phase-to-digital converter portion 131 would change even if the actual phase of the XO versus DIV_OUT signal were to remain constant.

FIG. 12 illustrates a phase-to-digital transfer function of DLPDC 134 as a line 146 labeled dTi. As the phase of the XO versus DIV_OUT signals increases, so too does the digital value dTi being output from the DLPDC 134. The transfer function represented by line 146 is linear. Unfortunately, a change in temperature can change the slope of the transfer function line 146. Such changes in transfer function slope (the slope is also referred to as "gain") are undesirable and can change the operation of PDC ADPLL in undesirable ways. A change in gain may, for example, change the bandwidth of the phase-locked loop, and therefore may change the time-to-lock of the ADPLL. Various communication protocols place different requirements on the time-to-lock of the ADPLL of the receiver local oscillator 106. For this and other reasons, it is desired that the gain of the phase-to-digital transfer function be as constant as possible over PVT as reasonably possible.

In accordance with one novel aspect, the novel correction portion 132 is provided. Novel correction portion 132 performs a function on the stream of first phase error words dTi to convert that stream into the stream of second phase error words dTi_corr, such that the slope of the overall phase-to-digital transfer function of phase-to-digital converter 126 remains substantially constant. The slope of the phase-to-digital transfer function of the stream of first phase error words is normalized to have a normalized slope 147 so that the slope of the second phase error words always has the same slope, even if changes in PVT cause propagation delay changes in the delay line 142. The phase-to-digital transfer function of the corrected second phase error words is represented in FIG. 12 by line 147.

Figure 13A:
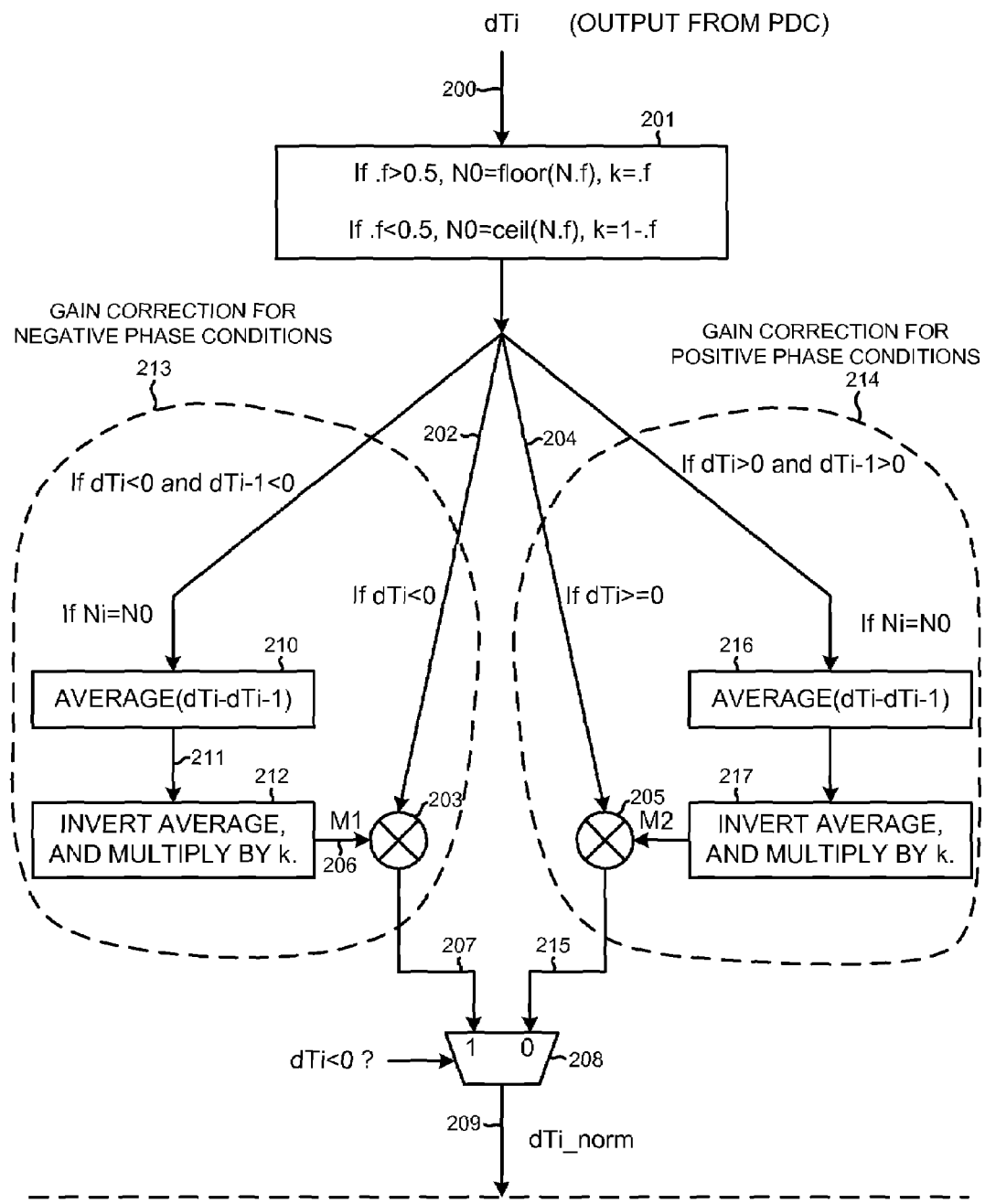

FIGS. 13A and 13B illustrate operations carried out by correction portion 132. In FIG. 13A, the stream of dTi first phase error words as output from DLPDC 134 is received as indicated by arrow 200 into processing block 201. For each dTi value received, there is a corresponding N.f loop divider value. If the fractional part f of the N.f value is greater than 0.5, then a value N0 is set to the integer portion N, and a value k is set to be the fractional f portion. If, on the other hand, the fractional part f of N.f is less than 0.5, then the value N0 is set to be the integer N+1, and the value k is set to be the value 1−f. As each dTi first phase error word is received, the corresponding values N0 and k are determined.

Next, if the dTi first phase error word is a negative value, then processing proceeds as indicated by arrow 202 to a multiplication function 203, otherwise if the dTi phase error word is zero or positive, then processing proceeds as indicated by arrow 204 to a multiplication function 205. The notation dTi indicates a first phase error word, whereas the notation dTi−1 indicates the previously generated first phase error word.

If the dTi phase error word is negative, and if the previous dTi−1 is not negative, then a multiplier value M1 206 is not changed. The dTi phase error word coming into multiplication function 203 as represented by arrow 202 is multiplied by M1, and the result is supplied as indicated by arrow 207 to multiplexing function 208. The dTi phase error word therefore is supplied to the output of multiplexing function 208 and becomes the value dTi_norm on arrow 209.

If, however, the dTi phase error word is negative and if the previous dTi−1 phase error word is also negative, then the multiplier value M1 is updated. The difference between the dTi and the previous dTi−1 is determined. In processing block 210, a running average of the last ten such differences is kept. The running average is supplied as indicated by arrow 211 to processing block 212. In block 212, the multiplier M1 is determined by taking the inverse of the running average, and then multiplying this inverse by the value k.

Accordingly, for a negative dTi "DIGITAL OUT" value in FIG. 12 that is disposed on the dashed line 146, the negative value is multiplied by multiplier M1 such that the dTi value is moved in the vertical dimension in the graph of FIG. 12 so that the resulting dTi_norm value is on the phase-to-digital transfer function line 147. Similarly, the previous negative dTi−1 value is also multiplied by multiplier M1 such that the dTi−1 value is moved in the vertical dimension in the graph of FIG. 12 so that the resulting dTi−1_norm value is on the phase-to-digital transfer function line 147. If there is no offset mismatch (offset mismatch is explained below), then the dTi_norm values dTi_norm and dTi−1_norm simply pass through the operations of FIG. 13B unchanged, and are output from the processing of FIG. 13B as the corrected dTi_corr and dTi−1_corr second phase error words.

The principle behind this PVT delay normalization is that DCO output frequency F1 is locked and is substantially fixed to about 0.1 parts per million when the PLL is in lock, and this remains true over changes in delay element delay due to PVT changes. The DCO period TDCO is therefore fixed, and can be determined by multiplying N.f by the known period of the reference clock XO. The relation of Equation 1 below is therefore true. In Equation 1, Ni represents the divisor value N by which loop divider 129 divided when dTi was measured.

$$dTi-dTi-1=(Ni-N.f)*Tvco \qquad \text{(Equ. 1)}$$

The units of the left side of the equation are delay element delays. The units of the right side of the equation are seconds. Equation 1 therefore can be used to determine the delay in seconds of a delay element in the phase-to-digital converter 126 as the PLL is operating. Also, the (dTi−dTi−1) is proportional to delay element delay. Once it is recognized that (dTi−dTi−1) is proportional to delay element delay, it is recognized that the value (dTi−dTi−1) can be used to normalize dTi measurements to account for changes in delay element delay. Accordingly, in the process flow of FIG. 13A, each negative dTi value is effectively divided by the value (dTi−dTi−1). The actual slope of the corrected stream of second phase error words is not as important as is ensuring that the slope of the stream of second phase error words does not change with changes in delay element propagation delay. Accordingly, determining of the multiplication value M1 in processing block 212 by multiplying the inverse of the running average of (dTi−dTi−1) by the value k is optional. The value k affects the slope of the resulting normalized transfer function.

FIG. 14 sets forth an example that illustrates how the novel correction circuit 132 carries out the PVT delay normalization. For a first PVT condition in which an inverter delay is 15 picoseconds, a first pair of dTi first phase error words is measured by DLPDC 134. The first dTi first phase error word is for the loop divider 129 dividing by N. The first dTi first phase error word is 10. The second dTi−1 of the first phase error words is for the loop divider 129 dividing by N+1. The second dTi−1 first phase error word is −5. These two dTi phase error words exhibit a first slope of a phase-to-digital transfer function line. In FIG. 15, line 148 illustrates this first slope.

When the processing of FIG. 13A is followed, each of the dTi and dTi−1 values is multiplied by a multiplier M1 that has the value (dTi−dTi−1) in its denominator. The multiplier M1 in the example of FIG. 14 is 0.06. The multiplication generates dTi_norm and dTi−1_norm values of 0.6 and −0.3, respectively. The pair of dTi_norm values exhibits a normalized slope of a phase-to-digital transfer function line. In FIG. 15, line 149 illustrates this normalized slope. If the stream of first phase error words do not exhibit gain mismatch or offset mismatch imperfections, then the processing of FIG. 13B does not change the dTi_norm and dTi−1_norm values, and the dTi_norm and dTi−1_norm values pass through the processing and become a pair of second phase error words dTi_corr and dTi−1_corr as supplied to digital loop filter 127. If, in processing step 212, the multiplier value is determined by multiplying by k, then in the example of FIG. 14 the slope of the stream of second phase error words is given by 1/TDCO.

Next, in the example of FIG. 14, there is a change in PVT conditions that causes the inverter delay to change to 25 picoseconds. A second pair of first phase error words is output from DLPDC 134. In the example of FIG. 14, these dTi and dTi−1 values are 20 and 11. This second pair of first phase error words exhibits a second slope of a phase-to-digital transfer function line. In FIG. 15, line 150 illustrates this second slope. When the processing of FIG. 13A is followed, the M1 multiplier is 0.1. The resulting dTi_norm and dTi−1_norm values are 2 and 1.1, respectively. This second pair of dTi_norm values is therefore seen to exhibit the same slope (1/TDCO of line 149) as did the first pair of dTi_norm values. The novel correction portion 132 therefore corrects for changes in phase-to-digital transfer function gain due to changes in the delays of the delay elements of delay line 142 due to PVT variations.

In addition to phase-to-digital gain changes due to PVT variations, there are other types of phase-to-digital transfer function imperfections for which novel correction portion 132 corrects. FIG. 16 illustrates a type of imperfection referred to as a "gain mismatch". The phase-to-digital transfer function of the values dTi coming out of DLPDC 134 may exhibit a first gain 151 for negative dTi values, but may exhibit a second gain 152 for positive dTi values. Note that in FIG. 16, the left portion of the dashed line labeled 151 has a steeper slope than does the right portion of the dashed line labeled 152. Novel correction portion 132 corrects the phase-to-digital transfer function such that the overall phase-to-digital transfer function phase-to-digital converter 126 has a single gain 153.

How correction portion 132 corrects the gain mismatch condition of FIG. 16 is set forth in FIG. 13A. Negative dTi first phase error words are corrected by processing 213, whereas positive dTi first phase error words are corrected by processing 214. Arrow 204 illustrates the flow of dTi values that are zero or positive. The dTi first phase error word entering multiplication process 205 is multiplied by a multiplier value M2 so that a normalized dTi value is supplied, as indicated by arrow 215, to multiplexing function 208. In the situation in which the dTi value is zero or positive, the multiplexing function 208 couples the "0" input to the multiplication function output. The dTi phase error word therefore is supplied to the output of multiplexing function 208 and becomes the value dTi_norm on arrow 209. Only if dTi and the previous dTi−1 are zero or positive, is the multiplier value M2 updated through the process of blocks 216 and 217. It is therefore seen that negative dTi values are normalized by a first multiplier M1 in processing 213, whereas positive dTi values are normalized by a second multiplier M2 in processing 214. The different multiplier values serve to adjust the slopes of the left and right portions 151 and 152 of the dashed line of FIG. 16 differently so that they both, as corrected, have the same slope.

FIG. 17 sets forth an example of correction portion 132 correcting for gain mismatch. For a first pair of positive dTi values 10 and 1, the processing 214 of the right portion of FIG. 13A results in a multiplier value M2 of 0.1. The slope of the transfer function is therefore adjusted to 1/TDCO. FIG. 18 illustrates this adjustment with arrow 154. For a second pair of negative dTi values −1 and −11, the processing 213 of the left portion of FIG. 13A results in a multiplier value M1 of 0.09. The slope of the transfer function is therefore adjusted to 1/TDCO. FIG. 18 illustrates this adjustment with arrow 155. Note that after correction, both the positive and negative portions of the phase-to-digital transfer function of the overall phase-to-digital converter 126 have the same slope.

FIG. 19 illustrates another type of phase-to-digital transfer function imperfection that novel correction portion 132 corrects. This type of imperfection is referred to as offset mismatch. Correction for offset mismatch is performed by the processing 218 set forth in FIG. 13B.

In FIG. 13B, the processing represented by blocks 219-222 measures the magnitude of the vertical offset mismatch C. If the current dTi_norm value is N0 and if the dTi_norm and the previous dTi−1_norm have the same signs as determined in decision block 219, then processing proceeds to processing 220. If, however, dTi_norm and the previous dTi−1_norm have different signs, then processing proceeds to processing 221. Processing 222 determines the magnitude of the vertical offset C. If dTi_norm is positive as determined by processing 223, then the vertical offset value C is effectively subtracted from the dTi_norm values by adding the offset value C to dTi_norm in processing 224. Conceptually, this amounts to moving the positive part 156 (see FIG. 19) of the transfer function down to align with the negative part 157. The calculated offset C determined by processing 222 of FIG. 13B is actually a negative number, so the value C that is added by processing 224 to dTi_norm actually serves to move portion 156 of the transfer function down. If, on the other hand, the dTi_norm value is zero or negative as determined by processing block 223, then the dTi_norm value represents a measurement on the left side of the phase-to-digital transfer function line. The dTi_norm value is therefore not modified. Conceptually, this amounts to not moving the negative part 157 of the transfer function of FIG. 19 downward. This is illustrated by block 225 in which the dTi_corr value is simply the incoming dTi_norm value.

Figures 20, 21:
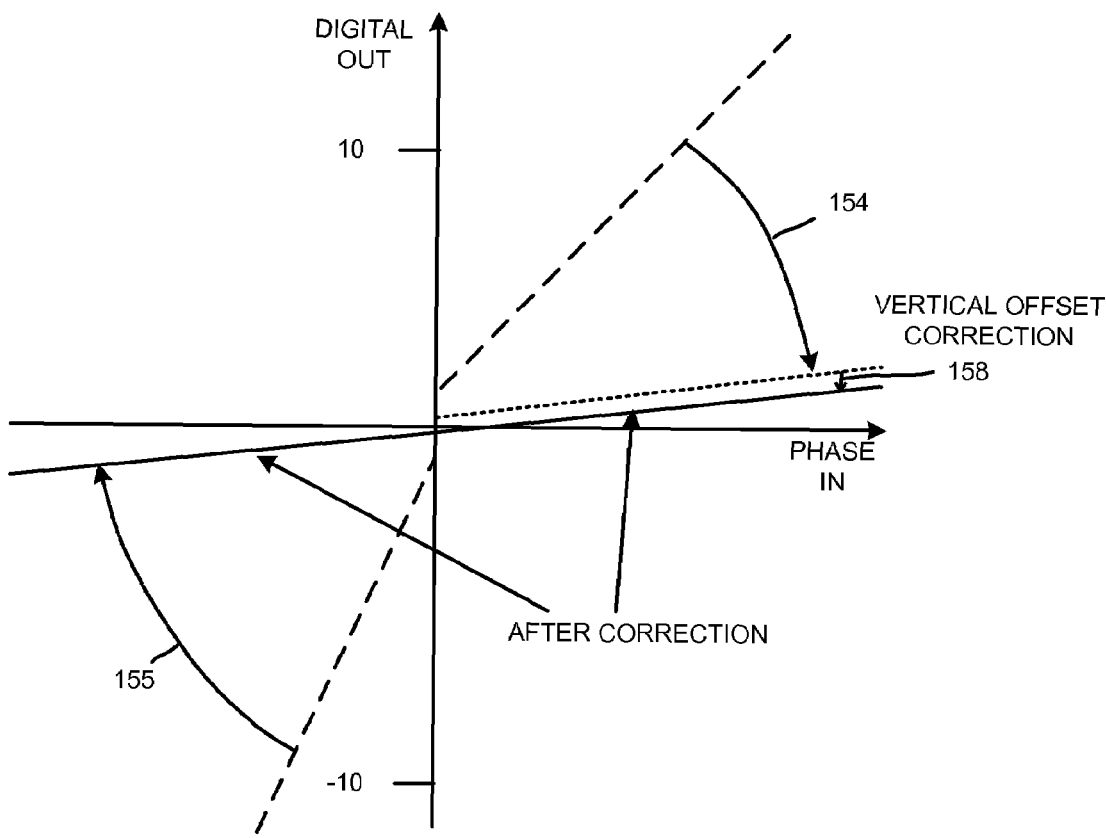
FIG. 20 sets forth an example of how the novel correction circuit 132 corrects for offset mismatch imperfections in a DLPDC phase-to-digital transfer function.
FIG. 21 is a graph that illustrates the correction operation of FIG. 20.

FIG. 20 sets forth a second part of the gain mismatch correction example of FIG. 17. The initial part of the example is set forth in FIGS. 17 and 18, and serves to correct for gain mismatch. The subsequent part of the example is set forth in FIGS. 20 and 21 and serves to correct for offset mismatch. For a first pair of positive dTi_norm and dTi−1_norm values of 1 and −0.3, the value B is determined in accordance with the processing of block 221 of FIG. 13B to be 1.3. There are also two other dTi_norm and dTi−1_norm values in the example of FIG. 17, and they are 1 and 0.1. In accordance with the processing 220 of FIG. 13B, the value A is determined to be 0.9. The vertical offset value C is therefore determined in processing 222 to be −0.4. In processing 224 of FIG. 13B, positive dTi_norm values are reduced by value C so that the vertical offset is eliminated from the phase-to-digital transfer function.

FIG. 21 is a diagram that depicts the combined result of the gain mismatch correction of FIGS. 17 and 18, and the subsequent offset correction of FIG. 20. Arrow 158 represents the operation of performing the offset correction in the example of FIG. 20.

Figure 22:
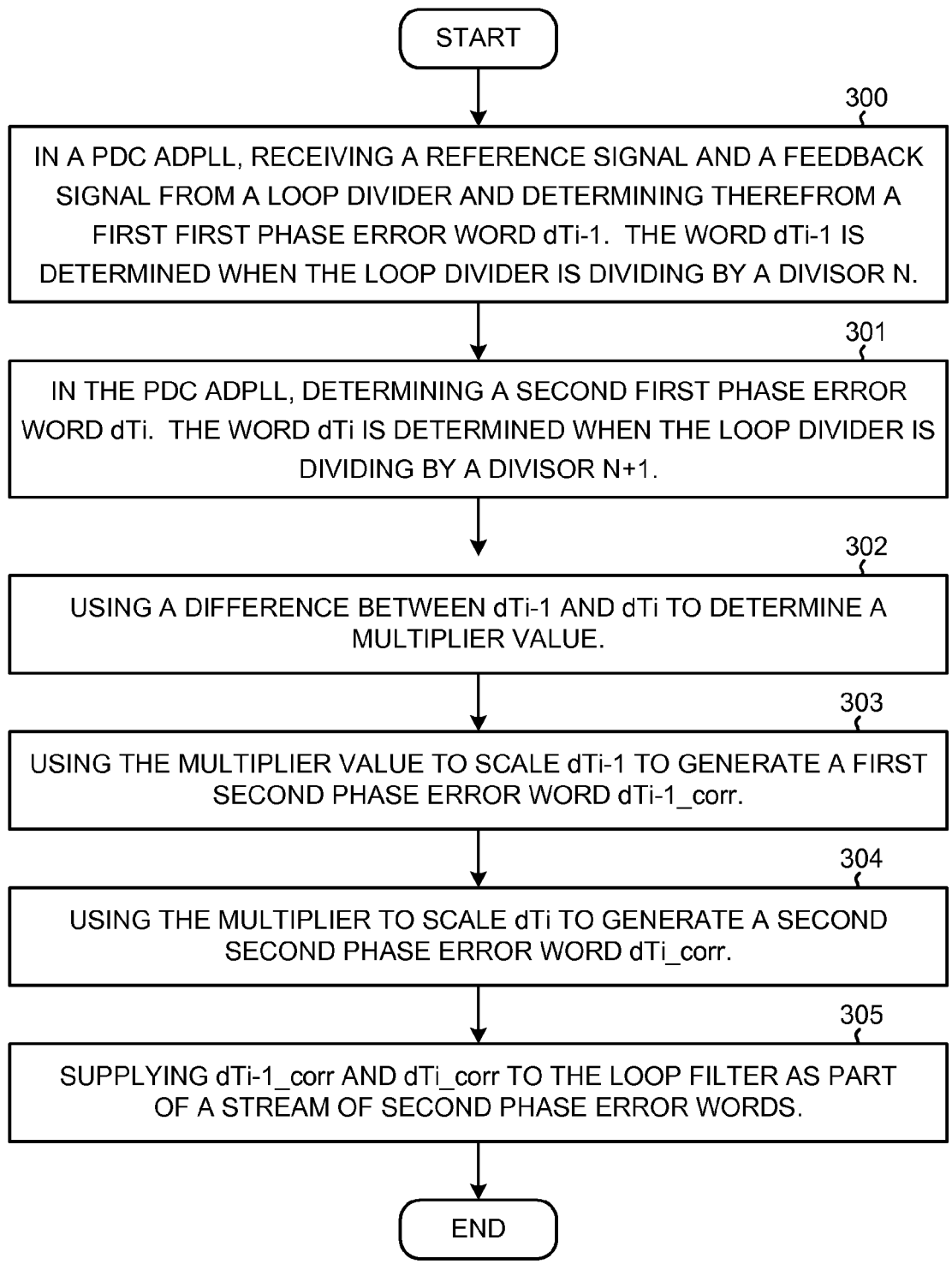
FIG. 22 is a simplified flowchart of a method in accordance with one novel aspect.

FIG. 22 is a flowchart of a method in accordance with one novel aspect. A Phase-to-Digital Converter portion of a PDC ADPLL receives a reference signal XO and a feedback signal DIV_OUT and from these two signals generates a stream of first phase error words. One of the first phase error words dTi−1 is determined (step 300) when the loop divider of the PLL is dividing by a divisor value N. The other of the first phase error words dTi is determined (step 301) when the loop filter is dividing by a divisor value N+1. A correction portion receives the two first phase error words dTi−1 and dTi and determines a difference between the two words. This difference is used to determine (step 302) a multiplier value. The multiplier value is then used (steps 303 and 304) to scale dTi−1 to become a first second phase error word dTi−1_corr, and to scale dTi to become a second second phase error word dTi_corr. The two second phase error words dTi−1_corr and dTi_corr are supplied to the loop filter (step 305) as part of a stream of second phase error words. The result of steps 300-305 is normalization of the slope of the overall phase-to-digital transfer function of the PDC portion and correction portion such that changes in delay element propagation delay in a delay line within the PDC portion does not cause slope changes in the overall phase-to-digital transfer function.

Although certain specific embodiments are described above for instructional purposes, the teachings of this patent document have general applicability and are not limited to the specific embodiments described above. The novel phase-to-digital transfer function correction methods described above are not restricted to the specific implementation of a PDC ADPLL set forth above. The novel methods can be used as long as the PDC operates by measuring time with delay lines. For example, the novel methods are usable in a PDC that does not involve a PFD. In addition, the novel phase-to-digital transfer function correction methods set forth above are not limited to determining (dTi−1-dTi) in situations in which the divisor is changed from N to N+1, but rather apply equally well to ADPLLs where a sigma-delta modulator controls the loop divider to divide by N and then another divisor that is not N+1 (for example, N+2, or N+3, or N−1, or N−2). Accordingly, various modifications, adaptations, and combinations of the various features of the described specific embodiments can be practiced without departing from the scope of the claims that are set forth below.

What is claimed is:

1. A phase-locked loop (PLL) circuit comprising:
a digitally controlled oscillator (DCO) that outputs a first signal;
a loop divider that receives the first signal and outputs a second signal; and
a phase-to-digital converter (PDC) that receives a reference signal and the second signal and generates a stream of second phase error words, wherein the PDC has an overall phase-to-digital transfer function, and wherein the PDC comprises:
a phase-to-digital converter portion that outputs a stream of first phase error words, the PDC portion having a first phase-to-digital transfer function; and
a correction portion that receives the stream of first phase error words and generates the stream of second phase error words such that the overall phase-to-digital transfer function is different from the first phase-to-digital transfer function.

2. The PLL of claim 1, further comprising:
a digital loop filter that receives the stream of second phase error words, filters the stream, and outputs a stream of tuning words to the DCO.

3. The PLL of claim 1, wherein the first phase-to-digital transfer function has a first gain, and wherein the correction portion generates the stream of second phase error words such that the overall phase-to-digital transfer function has a second gain.

4. The PLL of claim 1, wherein the first phase-to-digital transfer function exhibits a gain mismatch, and wherein the correction portion generates the stream of second phase error words such that the overall phase-to-digital transfer function has substantially less gain mismatch.

5. The PLL of claim 1, wherein the first phase-to-digital transfer function exhibits an offset mismatch, and wherein the correction portion generates the stream of second phase error words such that the overall phase-to-digital transfer function has substantially less offset mismatch.

6. The PLL of claim 1, wherein the loop divider divides by a first divisor N when a first first phase error word (dTi−1) is generated by the phase-to-digital converter portion, wherein the loop divider divides by a second divisor N+1 when a second first phase error word (dTi) is generated by the phase-to-digital converter portion, wherein the correction portion determines a difference between dTi and dTi−1 and uses the difference to determine a multiplier value, and wherein the correction portion uses the multiplier value to normalize at least a part of the stream of first phase error words.

7. The PLL of claim 1, wherein the loop divider divides by a first divisor N when a first first phase error word is generated by the phase-to-digital converter portion, wherein the loop divider divides by a second divisor N+1 when a second first phase error word is generated by the phase-to-digital converter portion, wherein the correction portion determines a difference between the first first phase error word and the second first phase error word to determine a multiplier value.

8. The PLL of claim 7, wherein the correction portion multiplies the first first phase error word by the multiplier value, and wherein the correction portion multiplies the second first phase error word by the multiplier value.

9. The PLL of claim 1, wherein the phase-to-digital converter portion of the phase-to-digital converter comprises:
a chain of digital logic delay elements having a plurality of nodes N1-NN, wherein a digital signal can propagate through the entire chain from node Ni to node NN in a propagation delay time; and
a plurality of sequential logic elements, wherein each sequential logic element has an input lead, wherein the input lead of each respective one of the sequential logic elements is coupled to a corresponding respective one of the nodes N1-NN, wherein the second signal has a period, and wherein the period is substantially greater than twice the propagation delay time.

10. The PLL of claim 1, wherein the reference signal has a first edge and a second edge during each period of the reference signal, wherein the second signal has a first edge and a second edge during each period of the second signal, and wherein each of the first phase error words is a digital value that represents a number of delay element delays between a time that a first edge of the reference signal occurs and a time that a first edge of the second signal occurs, and wherein the phase-to-digital converter portion of the PDC does not output digital words indicative of a number of delay element delays relative to either a second edge of the reference signal or a second edge of the second signal.

11. The PLL of claim 1, wherein each first phase error word is a signed digital value having a sign bit, wherein the sign bit indicates a phase relationship between the reference signal and the second signal.

12. The PLL of claim 1, wherein the first signal has a frequency F1, wherein the phase-to-digital converter portion of the PDC includes a chain of digital logic delay elements, and wherein no signal is made to propagate through the chain of digital logic delay elements that has a frequency greater than one quarter of F1.

13. The PLL of claim 1, wherein the first phase error words as received by the correction portion include positive first phase error words and negative first phase error words, and wherein the correction portion processes the positive first phase error words in a first way and processes the negative first phase error words in a second way.

14. The PLL of claim 1, wherein the first phase-to-digital transfer function has a first portion associated with first phase error words in a first range of values, wherein the first phase-to-digital transfer function has a second portion associated with first phase error words in a second range of values, wherein the first portion exhibits a first phase-to-digital gain, wherein the second portion exhibits a second phase-to-digital gain, wherein the correction portion adjusts the phase-to-digital gain of first phase error words in the first range differently than it adjusts the phase-to-digital gain of first phase error words in the second range.

15. The PLL of claim 14, wherein the correction portion of the PDC corrects for both a gain mismatch in the first phase-to-digital transfer function as well as an offset mismatch in the first phase-to-digital transfer function such that the gain mismatch and the offset mismatch are not present in the overall phase-to-digital transfer function.

16. The PLL of claim 1, wherein the loop divider divides by a divisor N.f having an integer portion N and a fractional portion f, wherein the correction portion of the PDC receives the divisor and uses the divisor to determine a first multiplier value and a second multiplier value, and wherein the correction portion multiplies a first set of the first phase error words by the first multiplier value to generate a first set of the second phase error words, and wherein the correction portion multiplies a second set of the first phase error words by the second multiplier value to generate a second set of the second phase error words.

17. A method comprising:
(a) in a phase-to-digital (PDC) all-digital phase-locked loop (ADPLL) determining a first first phase error word dTi−1, wherein dTi−1 is determined when a loop divider of the PDC ADPLL is dividing by a divisor N;
(b) in the PDC ADPLL determining a second first phase error word dTi, wherein dTi is determined when the loop divider is dividing by a divisor N+1;
(c) using a difference between dTi and dTi−1 to determine a multiplier value;
(d) using the multiplier value to scale dTi−1 to generate a first second phase error word dTi−1_corr; and
(e) using the multiplier value to scale dTi−1 to generate a second second phase error word dTi_corr.

18. The method of claim 17, wherein dTi−1 and dTi are generated in steps (a) and (b) by a phase-to-digital converter portion of the PDC ADPLL, wherein the phase-to-digital converter portion has a first phase-to-digital transfer function, wherein the first phase-to-digital transfer function has a gain that is temperature dependent, wherein the dTi−1_corr and dTi_corr are generated in steps (d) and (e) by a correction portion of the PDC ADPLL, wherein the phase-to-digital converter portion and the correction portion together have a second phase-to-digital transfer function, and wherein the second phase-to-digital transfer function has a gain that is substantially temperature independent.

19. The method of claim 17, wherein dTi−1 and dTi are generated in steps (a) and (b) by a phase-to-digital converter portion of the PDC ADPLL, wherein the phase-to-digital converter portion has a first phase-to-digital transfer function, wherein the first phase-to-digital transfer function exhibits a gain mismatch imperfection, wherein the dTi−1_corr and dTi_corr are generated in steps (d) and (e) by a correction portion of the PDC ADPLL, wherein the phase-to-digital converter portion and the correction portion together have a second phase-to-digital transfer function, and wherein the second phase-to-digital transfer function exhibits substantially no gain mismatch imperfection.

20. The method of claim 17, wherein dTi−1 and dTi are generated in steps (a) and (b) by a phase-to-digital converter portion of the PDC ADPLL, wherein the phase-to-digital converter portion has a first phase-to-digital transfer function, wherein the first phase-to-digital transfer function exhibits an offset mismatch imperfection, wherein the dTi−1_corr and dTi_corr are generated in steps (d) and (e) by a correction portion of the PDC ADPLL, wherein the phase-to-digital converter portion and the correction portion together have a second phase-to-digital transfer function, and wherein the second phase-to-digital transfer function exhibits substantially no offset mismatch imperfection.

21. A phase-locked loop comprising:
a phase-to-digital converter portion that receives a reference signal and a feedback signal and that outputs a stream of first phase error words, wherein the feedback signal and the feedback signal are of substantially the same frequency, wherein the phase-to-digital converter portion has a first phase-to-digital transfer function that exhibits a temperature dependence; and
means for processing the stream of first phase error words to generate a stream of second phase error words, wherein the phase-to-digital converter portion and the means together have a second phase-to-digital transfer function, wherein the processing is such that the second phase-to-digital transfer function is substantially temperature independent.

22. The phase-locked loop of claim 21, wherein the means determines a difference between a first of the first phase error words and a second of the first phase error words, wherein the means uses the difference to generate a multiplier value, wherein the means multiplies the first of the first phase error words by the multiplier value, and wherein the means multiplies the second of the first phase error words by the multiplier value.

23. The phase-locked loop of claim 21, wherein the first phase-to-digital transfer function also exhibits a gain mismatch, and wherein the means generates the stream of second phase error words such that the gain mismatch is not present in the second phase-to-digital transfer function.

24. The phase-locked loop of claim 21, wherein the first phase-to-digital transfer function also exhibits an offset mismatch, and wherein the means generates the stream of second phase error words such that the offset mismatch is not present in the second phase-to-digital transfer function.

* * * * *